(12) United States Patent
Dosluoglu et al.

(10) Patent No.: US 7,176,544 B2
(45) Date of Patent: Feb. 13, 2007

(54) RED/GREEN PIXEL WITH SIMULTANEOUS EXPOSURE AND IMPROVED MTF

(75) Inventors: Taner Dosluoglu, New York, NY (US); Michael Henry Brill, Kingston, NJ (US)

(73) Assignee: Dialog Imaging Systems GmbH, Kirchheim/Teck-Nabern (DE)

( * ) Notice: Subject to any disclaimer, the term of this patent is extended or adjusted under 35 U.S.C. 154(b) by 518 days.

(21) Appl. No.: 10/813,864

(22) Filed: Mar. 31, 2004

(65) Prior Publication Data

US 2004/0201073 A1    Oct. 14, 2004

Related U.S. Application Data

(60) Provisional application No. 60/462,833, filed on Apr. 14, 2003.

(51) Int. Cl.
*H01L 31/00* (2006.01)

(52) U.S. Cl. .................... 257/440; 257/414; 257/428; 257/431; 257/E27.134

(58) Field of Classification Search ................ None
See application file for complete search history.

(56) References Cited

U.S. PATENT DOCUMENTS 4,011,016 A    3/1977    Layne et al.

(Continued)

FOREIGN PATENT DOCUMENTS

EP    949 689 A2    10/1999

(Continued)

*Primary Examiner*—Nathan J. Flynn
*Assistant Examiner*—Kevin Quinto
(74) *Attorney, Agent, or Firm*—Saile Ackerman LLC; Stephen B. Ackerman; Larry J. Prescott

(57) ABSTRACT

A pixel for detecting red and green light is a single pixel is described. The pixel comprises a deep N well formed in a P type epitaxial substrate. The pixel comprises a deep N well formed in a P type epitaxial substrate. A number of P wells, which are used as the sensor nodes, are formed in the deep N well. The use of these P wells as the sensor nodes improves the modulation transfer function. The depth of the deep N well is about equal to the depth of hole electron pairs generated by red light in silicon. The depth of the P wells is about equal to the depth of hole electron pairs generated by green light in silicon. A red/green signal is determined at each P well by determining the potentials between each of the P wells and the deep N well after a charge integration cycle with the P wells and the deep N well isolated. A green signal is determined at each P well by determining the potentials between each of the P wells and the deep N well after a charge integration cycle with the P wells isolated and the deep N well held at a fixed positive voltage. A red signal at each P well is determined by subtracting the green signal at that P well from the red/green signal at that P well. The invention can take advantage of the fact that the human perception of a green signal is green, the human perception of a red signal is red, and the human perception of a red/green signal is red. The invention also works if P regions are substituted for N regions and N regions substituted for P regions.

30 Claims, 2 Drawing Sheets

U.S. PATENT DOCUMENTS

| | | |
|---|---|---|
| 4,309,604 A | 1/1982 | Yoshikawa et al. |
| 4,613,895 A | 9/1986 | Burkey et al. |
| 5,703,642 A | 12/1997 | Stevens ........................ 348/317 |
| 5,962,906 A | 10/1999 | Liu ............................. 257/432 |
| 5,965,875 A | 10/1999 | Merrill |
| 5,999,279 A | 12/1999 | Kouzaki et al. ............. 358/520 |
| 6,130,466 A * | 10/2000 | Schneider et al. .......... 257/440 |
| 6,137,100 A | 10/2000 | Fossum et al. ........... 250/208.1 |
| 6,150,683 A | 11/2000 | Merrill et al. .............. 257/292 |
| 6,359,323 B1 | 3/2002 | Eom et al. ................... 257/440 |
| 6,417,950 B1 | 7/2002 | Cathey, Jr. .................. 359/237 |

FOREIGN PATENT DOCUMENTS

| | | |
|---|---|---|
| WO | WO 00/62350 | 10/2000 |

* cited by examiner

RED/GREEN PIXEL WITH SIMULTANEOUS EXPOSURE AND IMPROVED MTF

This patent application claims priority to the following U.S. Provisional Patent Application, herein incorporated by reference:

60/462,833, filed Apr. 14, 2003

BACKGROUND OF THE INVENTION (1) Field of the Invention

This invention relates to a CMOS pixel and more particularly to a CMOS pixel which responds to red and green light and to a method of separating red and green light signals.

(2) Description of the Related Art

Pixels are used in image sensors to convert an optical image into electrical signals. Since it is usually necessary to extract color information from these optical images the pixels must have a means for detecting the various colors and separating them into different electrical signals.

U.S. Pat. No. 6,417,950 B1 to Cathey, Jr. describes apparatus for increasing color resolution and quality in digital imaging systems which temporarily modulates red, green, and blue light, detects all three colors at each pixel, and band pass filters the detected light to extract values for red, green, and blue.

U.S. Pat. No. 6,359,323 B1 to Eom et al. describes a method for fabricating a color image sensor.

U.S. Pat. No. 6,150,683 to Merrill et al. describes a CMOS based color pixel with reduced noise in the blue signal.

U.S. Pat. No. 6,137,100 to Fossum et al. describes an active pixel sensor with separated pixel areas each sensing a different primary color of red, green, or blue.

U.S. Pat. No. 5,999,279 to Kouzaki et al. describes an image forming apparatus having an MTF correction unit.

U.S. Pat. No. 5,962,906 to Liu describes a color sensor which uses a color sensor layer having a number of color sensor areas which absorb and sense different colors of light.

U.S. Pat. No. 5,703,642 to Stevens describes a clocking methodology to improve the MTF, modulation transfer function.

SUMMARY OF THE INVENTION

Pixels are used in imagers to convert an optical image into appropriate electrical signals. The pixels respond to input signals, such as light radiation, which change the charge stored in a reverse biased PN junction. In forming a color image means must be used to acquire separate electrical signals which relate to the various spectral elements of the incident light radiation, such as red, green and blue. Various methods have been used to achieve this separation of electrical signals, such as color filters or separate pixels for red, green, and blue light radiation. It is very advantageous to be able to separate red and green signals from a single pixel without the use of color filters while achieving improved modulation transfer function, MTF, and improved resolution.

The red signal in a pixel is due to charges accumulated at a PN junction due to hole electron pairs created deep below the surface of the pixel. At this depth a lack of electric field due to undepleted regions allows carriers to diffuse laterally between nearby pixels before being collected causing a lack of resolution or degraded modulation transfer function, MTF, for the red signal. This problem is most severe for the red light signal but can also be significant for the green signal.

It is a principle objective of this invention to provide a method of separating red and green input signals without the use of color filters while achieving improved modulation transfer function and resolution.

It is another principle objective of this invention to provide an active pixel sensor which can separate red and green input signals without the use of color filters while achieving improved modulation transfer function and resolution.

These objectives are achieved by forming a deep N well, deeper than the N wells in the typical pixel, in a P type epitaxial silicon substrate. A number of P wells are then formed in the deep N well to form a pixel for each P well. An $N^+$ region is then formed in each of the P wells and a $P^+$ region is formed in the deep N well. The depth of the deep N well is such that the charge accumulated at the PN junction between the deep N well and the P epitaxial substrate is due to the red light incident on the pixel. The depth of the P wells is such that the charge accumulated at the PN junction between a P well and the deep N well is due to a combination of the red and green light incident on the pixel.

This invention makes use of the charge accumulated at the PN junction between the P wells and the deep N well to determine both the red and green signals. This is accomplished by determining a red/green signal at the junction between each of the P wells and the deep N well by a measurement of the potential between the P well and the deep N well after a charge integration period in which the deep N well is floating. A green signal is determined by suppressing the red signal during a charge integration period. This red signal suppression is accomplished by a measurement of the potential between the P well and the deep N well after a charge integration period in which the deep N well is held at a fixed potential thereby suppressing the red signal and determining a green signal. A red signal is then determined by subtracting the red signal from the red/green signal. Since the red signal is determined by charge accumulated at the junction between the P wells and the deep N well, and not the charge accumulated between the junction between the deep N well and the substrate, the modulation transfer function, MTF, or resolution of the red signal is significantly improved.

This invention can take advantage of the fact that the human perception of a red signal is that of a red signal, the human perception of a green signal is that of a green signal, and the human perception of a mixture of red and green signals is that of a red signal. In certain cases the red/green signal can be used as a red signal, since the human perception of a mixture of red and green signals is that of a red signal.

All of the junctions described in this invention are available in standard deep submicron CMOS processing.

The invention can also be implemented using a deep P well formed in an N type epitaxial substrate. A number of N wells are then formed in the deep P well. In this case $N^+$ regions are replaced by $P^+$ regions and $P^+$ regions are replaced by $N^+$ regions.

DESCRIPTION OF THE PREFERRED EMBODIMENTS

Figure 1:
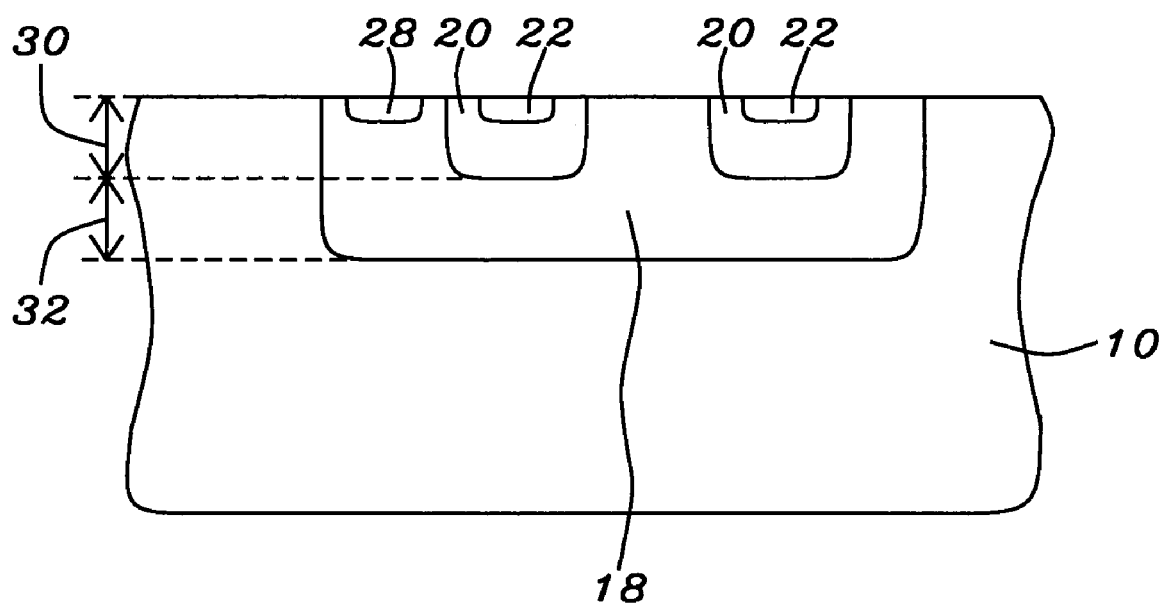
FIG. 1 shows a cross section view of two pixels of this invention formed in a substrate.

Refer to FIG. 1 for a description of the red and green pixel of this invention. FIG. 1 shows a deep N well 18 formed in a P type silicon substrate 10, typically a P type epitaxial substrate. A number of P wells 20 are formed in the deep N well. There can be any number of P wells 20 formed in the deep N well 18 but two such P wells 20 are described in this embodiment and shown in FIG. 1. Each of the P wells 20 is to be used as a sense node in the pixel. An $N^+$ region 22 is formed in each of the P wells 20 for electrical contact, as shown in FIG. 1. A $P^+$ region 28 is formed in the deep N well 18 for electrical contact. The depth 32 of the deep N well 18 is such that the charge accumulated at the PN junction between the deep N well 18 and the P type substrate 10 will be due to the electron hole pairs generated within a depth of between about 1.0 and 3.0 microns. In this example depth 32 of the deep N well 18 is between about 1.0 and 3.0 microns. The depth 30 of the P wells 20 is such that the charge accumulated at the PN junction between the first P wells 20 and the deep N well 18 will be due to the electron hole pairs generated within a depth of between about 0.1 and 0.65 microns in the vicinity of each of the P wells 20. In this example the depth 30 of the P wells 20 is between about 0.1 and 0.65 microns. The hole electron pairs generated within a depth of between about 0.65 and 1.0 microns in the vicinity of each of the P wells 20 will contribute to both the charge accumulated at the PN junctions between each of the P wells 20 and the deep N well 18 and the PN junction between the deep N well 18 and the P type substrate 10.

This structure results in the charge accumulated at the PN junctions between each of the P wells 20 and the deep N well 18 being due to hole electron pairs produced by both red and green light in the vicinity of each of the P wells 20. The charge accumulated at the PN junction between the deep N well 18 and the P type substrate 10 will be due to hole electron pairs produced by red light.

In this invention the P wells 20 are used as the sense nodes of the pixel. This makes it necessary to separate the red and green signals at each of the P wells 20. This is accomplished by suppressing the red signal during a part of the charge integration period. If the deep N well 18 is biased with a sufficiently positive supply during part of the charge integration period it will act as a carrier drain for the hole electron pairs generated by red light during that part of the charge integration period and the charge accumulated at the PN junctions between each of the P wells 20 and the deep N well 18 will be due only to the amount of green light in the vicinity of each of the P wells and a green signal can be extracted from each of the P wells 20 by determining the potential between each of the P wells 20 and the deep N well 18. If both the N well 18 and the P wells 20 are left floating during part of the charge integration period the potential of the P wells 20 will be directly impacted by the potential of the deep N well 18 and the charge accumulated at the PN junctions between each of the P wells and the N well 18 will be due to the amount of both red and green light in the vicinity of each pixel. A red/green signal can then be extracted from each of the P wells 20 by determining the potential between each of the P wells 20 and the deep an well 18. The red signals can be obtained by subtracting the green signal from the green/red signal at each of the P wells 20.

This invention can take advantage of the fact that the human perception of a red signal is that of a red signal, the human perception of a green signal is that of a green signal, and the human perception of a mixture of red and green signals is that of a red signal. In certain cases the red/green signal can be used as a red signal, since the human perception of a mixture of red and green signals is that of a red signal.

Figure 2:
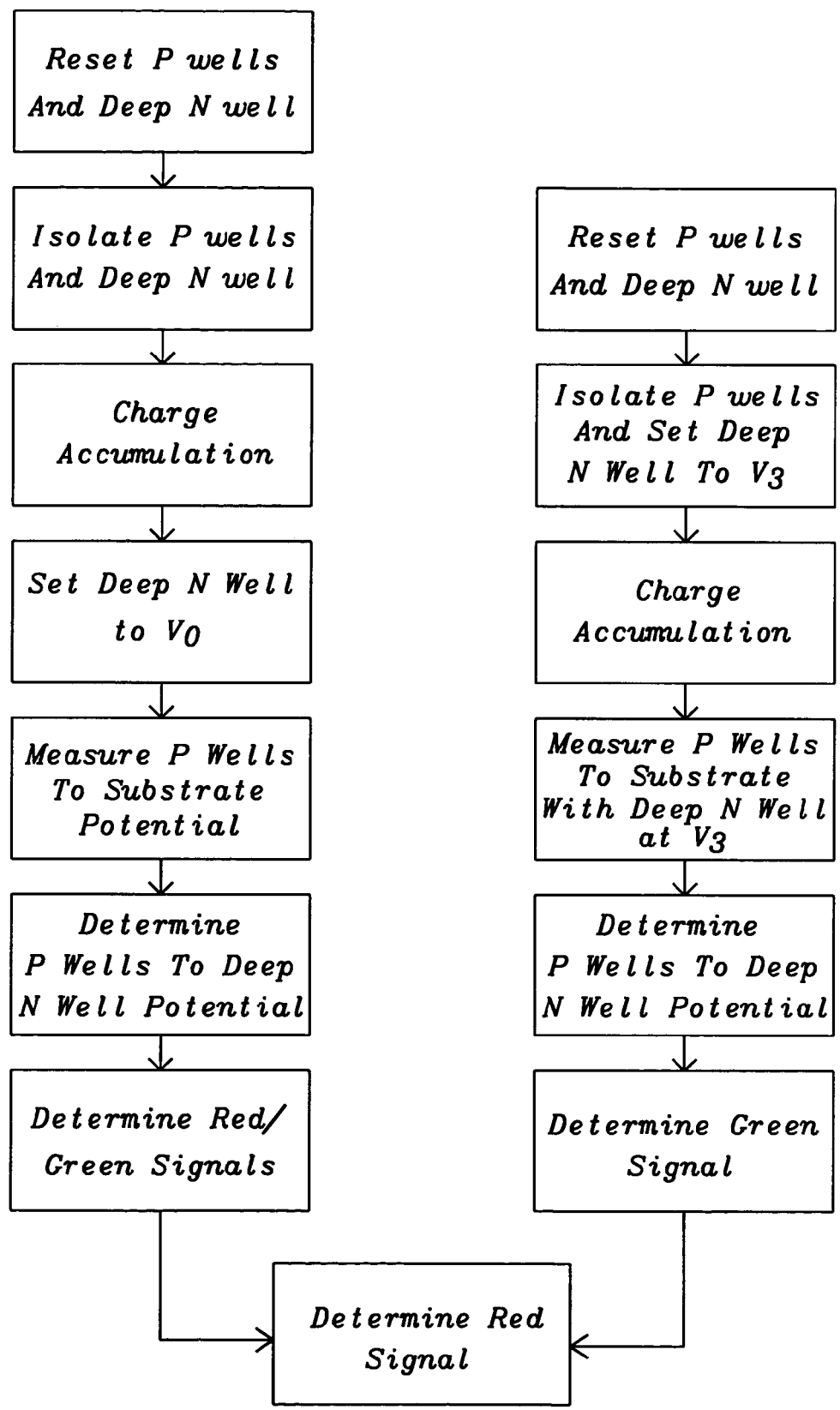
FIG. 2 shows a flow diagram of the method of this invention.

A method of achieving the red/green separation will now be described with reference to FIGS. 1 and 2. In this method the potential between the potential between each of the P wells 20 and the deep N well 18 will be determined by measuring only the potential between each of the P wells 20 and the P type substrate 10, which is typically at ground potential. This reduces the required number of electrodes to the pixel and improves the fill factor of the pixel. FIG. 1 shows a cross section view of the pixel and FIG. 2 shows a flow diagram of the method. The potential between each of the P wells 20 and the deep N well 18 could also be measured directly if desired.

To obtain a red/green signal the pixel is reset by setting the potential between each of the P wells 20 and the substrate 10 to a first voltage, $V_1$, and the potential between the deep N well 18 and the substrate 10 to a second voltage, $V_2$. The P wells 20 and the deep N well 18 are then electrically isolated and charge due to hole electron pairs generated by green and red light is accumulated at the PN junctions between each of the P wells 20 and the deep N well 18 during a charge integration period. The potential between the N well 18 and the substrate 10 is then set at a fixed voltage, $V_0$, and the potential between each of the P wells 20 and the substrate 10 is measured. The potential between each of the P wells 20 and the deep N well 18 can then be determined by subtracting the fixed voltage, $V_0$. The potential between each of the P wells 20 and the deep N well 18 at the end of this charge integration period is used to determine a red/green signal at each of the P wells 20.

To provide a green signal the pixel is reset by resetting the potential between each of the P wells 20 and the substrate 10 to the first voltage, $V_1$, and the potential between the deep N well 18 and the substrate 10 to the second voltage, $V_2$. The P wells 20 are then electrically isolated and the potential between the deep N well 18 and the substrate 10 is maintained at a third voltage, $V_3$, during another charge integration period. The third voltage, $V_3$, is sufficiently positive so that it will act as a carrier drain for the hole electron pairs generated by red light during this charge integration period and the charge accumulated at the PN junctions between each of the P wells 20 and the deep N well 18 will be due only to the amount of green light in the vicinity of each of the P wells. The potential between each of the P wells and the substrate 10 is measured at the end of this charge integration period while maintaining the potential between the deep N well 18 and the substrate 10 at the third voltage, $V_3$. The potential between each of the P wells 20 and the deep N well 18 at the end of this charge integration period can then be determined by subtracting the third voltage, $V_3$, from the potential between each of the P wells 20 and the substrate 10. The potential between each of the P wells 20 and the deep N well 18 at the end of this charge integration period is used to determine a green signal at each of the P wells 20.

The order of determination of the red/green signal and the green signal does not matter. The red/green signal is determined by resetting the pixel, isolating the P wells 20 and the deep N well 18, carrying out a charge accumulation period, setting the potential between the deep N well 18 and the substrate 10 at a fixed potential, measuring the potential between each of the P wells 18 and the substrate 10, determining the potentials between each of the P wells 20 and the deep N well 18, and determining a green/red signal at each of the P wells 20. The green signal is determined by resetting the pixel, isolating the P wells 20, setting the potential between the deep N well 18 and the substrate 10 at a fixed potential, carrying out a charge accumulation period, holding the potential between the deep N well 18 and the substrate 10 at a fixed potential, measuring the potentials between each of the P wells 18 and the substrate 10, determining the potentials between each of the P wells 20 and the deep N well 18, and determining a green signal. The method could also be used to determine only a red signal or only a red/green signal if that were desired.

The potential between each of the P wells 20 and the deep N well 18 at the end of a charge integration period is used to determine a green/red signal at each of the P wells 20. The potential between each of the P wells 20 and the deep N well 18 at the end of another charge integration period is used to determine a green signal at each of the P wells 20. A red signal at each of the P wells 20 can then be obtained by subtracting the green signal at each of the P wells 20 from the red/green signal at each of the P wells 20.

Typically reset transistors, not shown, are used in the reset operations of the pixel. In this case a reset transistor is connected between each of the N$^+$ regions 22 formed in each of the P wells 20 and a voltage supply and another reset transistor is connected between the P$^+$ region 28 formed in the deep N well 18 and a voltage supply. Transistors, not shown, connected between the P$^+$ region 28 formed in the deep N well 18 and a voltage supply can also be used to maintain the deep N well 18 at a fixed potential.

If the signal generated at the PN junction between the deep N well 18 and the P type substrate 10, which is due to hole electron pairs generated by red light, is used to determine the red signal, this red signal will be over the entire junction between the deep N well 18 and the P type substrate 10 and will provide a red signal with lower resolution. Since only the charge accumulated at the PN junctions between each of the P wells 20 and the deep N well 18 are used to extract the red and green signals the modulation transfer function, MTF, or resolution of the pixel is significantly improved by the pixel and method of this invention.

Those skilled in the art will recognize that this invention will also work with the P type substrate 10, typically a P type epitaxial substrate, replaced by an N type substrate 10, typically an N type epitaxial substrate, the deep N well 18 replaced by a deep P well 18, the P wells 20 replaced by N wells 20, the N$^+$ regions 22 replaced by P$^+$ regions 22, and the P$^+$ region 28 replaced by an N$^+$ region 28, see FIG. 1. In this case the polarity of the potentials between any two points are reversed.

All of the junctions described in this invention are available in standard deep submicron CMOS processing.

While the invention has been particularly shown and described with reference to the preferred embodiments thereof, it will be understood by those skilled in the art that various changes in form and details may be made without departing from the spirit and scope of the invention.

What is claimed is:

1. A method of extracting red and green signals from an active pixel sensor, comprising:
    providing a pixel comprising a P type silicon substrate, a deep N well formed in said substrate, a number of P wells formed in said deep N well, an N$^+$ region formed in each of said P wells, and a P$^+$ region formed in said deep N well, wherein said deep N well has a first depth which is about equal to the depth of hole electron pairs generated in silicon by red light and each of said P wells has a second depth which is about equal to the depth of hole electron pairs generated in silicon by green light;
    electrically isolating said P wells and said deep N well, after resetting the potential between each of said P wells and said substrate to a first voltage and the potential between said deep N well and said substrate to a second voltage, accumulating charge at the PN junctions between each of said P wells and said deep N well, and determining the potential between each of said P wells and said deep N well, wherein the potential between each of said P wells and said deep N well provides a red/green signal at each of said P wells;
    electrically isolating said P wells and maintaining said deep N well at a third voltage, after resetting the potential between each of said P wells and said substrate to said first voltage and the potential between said deep N well and said substrate to said second voltage, accumulating charge at the PN junctions between each of said P wells and said deep N well, and determining the potential between each of said P wells and said deep N well, wherein the potential between each of said P wells and said deep N well provides a green signal at each of said P wells; and
    determining a red signal at each of said P wells by subtracting said green signal at each of said P wells from said red/green signal at that said P well.

2. The method of claim 1 wherein said first, second, and third voltages are all greater than zero.

3. The method of claim 1 wherein said determining the potential between each of said P wells and said deep N well comprises determining the potential between each of said P wells and said substrate, while holding the potential between said deep N well and said substrate at a fourth voltage, and subtracting said fourth voltage from said potential between each of said P wells and said substrate.

4. A method of extracting red and green signals from an active pixel sensor, comprising:
    providing a pixel comprising an N type silicon substrate, a deep P well formed in said substrate, a number of N wells formed in said deep P well, a P$^+$ region formed in each of said N wells, and an N$^+$ region formed in said deep P well, wherein said deep P well has a first depth which is about equal to the depth of hole electron pairs generated in silicon by red light and each of said N wells has a second depth which is about equal to the depth of hole electron pairs generated in silicon by green light;
    electrically isolating said N wells and said deep P well, after resetting the potential between each of said N wells and said substrate to a first voltage and the potential between said deep P well and said substrate to a second voltage, accumulating charge at the PN junctions between each of said N wells and said deep P well, and determining the potential between each of said N wells and said deep P well, wherein the potential between each of said N wells and said deep P well provides a red/green signal at each of said N wells;
    electrically isolating said N wells and maintaining said deep P well at a third voltage, after resetting the potential between each of said N wells and said substrate to said first voltage and the potential between said deep P well and said substrate to said second voltage, accumulating charge at the PN junctions between each of said N wells and said deep P well, and determining the potential between each of said N wells and said deep P well, wherein the potential between each of said N wells and said deep P well provides a green signal at each of said N wells; and determining a red signal at each of said N wells by subtracting said green signal at each of said N wells from said red/green signal at that said N well.

5. The method of claim 4 wherein said first, second, and third voltages are all less than zero.

6. The method of claim 4 wherein said determining the potential between each of said N wells and said deep P well comprises determining the potential between each of said N wells and said substrate, while holding the potential between said deep P well and said substrate at a fourth voltage, and subtracting said fourth voltage from said potential between each of said N wells and said substrate.

7. A method of extracting red and green signals from an active pixel sensor, comprising:

providing a pixel comprising a P type silicon substrate, a deep N well formed in said substrate, a number of P wells formed in said deep N well, an $N^+$ region formed in each of said P wells, and a $P^+$ region formed in said deep N well, wherein said deep N well has a first depth which is about equal to the depth of hole electron pairs generated in silicon by red light and each of said P wells has a second depth which is about equal to the depth of hole electron pairs generated in silicon by green light;

resetting the potential between each of said P wells and said substrate to a first voltage and the potential between said deep N well and said substrate to a second voltage during a first reset period;

electrically isolating said P wells and said deep N well, and accumulating charge at the PN junctions between each of said P wells and said deep N well during a first charge integration period, wherein said first charge integration period immediately follows said first reset period;

determining the potential between each of said P wells and said deep N well at the end of said first charge integration period;

resetting the potential between each of said P wells and said substrate to said first voltage and the potential between said deep N well and said substrate to said second voltage during a second reset period;

electrically isolating said P wells, maintaining the potential between said deep N well and said substrate at a third voltage, and accumulating charge at the PN junctions between each of said P wells and said deep N well during a second charge integration period, wherein said second charge integration period immediately follows said second reset period;

determining the potential between that each of said P wells and said deep N well at the end of said second charge integration period;

determining a red/green signal at each of said P wells, wherein said red/green signal at each of said P wells is the potential between that said P well and said deep N well at the end of said first charge integration period;

determining a green signal at each of said P wells, wherein said green signal at each of said P wells is the potential between that said P well and said deep N well at the end of said second charge integration period; and determining a red signal at each of said P wells by subtracting said green signal at each of said P wells from said red/green signal at that said P well.

8. The method of claim 7 wherein said first depth is between about 1.0 and 3.0 micrometers.

9. The method of claim 7 wherein said second depth is between about 0.1 and 0.65 micrometers.

10. The method of claim 7 wherein said first, second, and third voltages are all greater than zero.

11. The method of claim 7 wherein said second voltage is equal to said third voltage.

12. The method of claim 7 wherein said determining the potential between each of said P wells and said deep N well at the end of said first charge integration period comprises setting the potential between said deep N well and said substrate to a fourth voltage with said P wells isolated, determining the potential between each of said P wells and said substrate; and subtracting said fourth voltage from said potential between each of said P wells and said substrate.

13. The method of claim 12 wherein said fourth voltage is equal to said third voltage.

14. The method of claim 7 wherein said determining the potential between each of said P wells and said deep N well at the end of said second charge integration period comprises maintaining the potential between said deep N well and said substrate at said third voltage with said P wells isolated, determining the potential between each of said P wells and said substrate; and subtracting said third voltage from said potential between each of said P wells and said substrate.

15. A method of extracting red and green signals from an active pixel sensor, comprising:

providing a pixel comprising an N type silicon substrate, a deep P well formed in said substrate, a number of N wells formed in said deep P well, a $P^+$ region formed in each of said N wells, and an $N^+$ region formed in said deep P well, wherein said deep P well has a first depth which is about equal to the depth of hole electron pairs generated in silicon by red light and each of said N wells has a second depth which is about equal to the depth of hole electron pairs generated in silicon by green light;

resetting the potential between each of said N wells and said substrate to a first voltage and the potential between said deep P well and said substrate to a second voltage during a first reset period;

electrically isolating said N wells and said deep P well, and accumulating charge at the PN junctions between each of said N wells and said deep P well during a first charge integration period, wherein said first charge integration period immediately follows said first reset period;

determining the potential between that each of said N wells and said deep P well at the end of said first charge integration period;

resetting the potential between each of said N wells and said substrate to said first voltage and the potential between said deep P well and said substrate to said second voltage during a second reset period;

electrically isolating said N wells, maintaining the potential between said deep P well and said substrate at a third voltage, and accumulating charge at the PN junctions between each of said N wells and said deep P well during a second charge integration period, wherein said second charge integration period immediately follows said second reset period;

determining the potential between each of said N wells and said deep P well at the end of said second charge integration period;

determining a red/green signal at each of said N wells, wherein said red/green signal at each of said N wells is the potential between that said N well and said deep P well at the end of said first charge integration period;

determining a green signal at each of said N wells, wherein said green signal at each of said N wells is the potential between that said N well and said deep P well at the end of said second charge integration period; and determining a red signal at each of said N wells by subtracting said green signal at each of said N wells from said red/green signal at that said N well.

16. The method of claim 15 wherein said first depth is between about 1.0 and 3.0 micrometers.

17. The method of claim 15 wherein said second depth is between about 0.1 and 0.65 micrometers.

18. The method of claim 15 wherein said first, second, and third voltages are all less than zero.

19. The method of claim 15 wherein said second voltage is equal to said third voltage.

20. The method of claim 15 wherein said determining the potential between each of said N wells and said deep P well at the end of said first charge integration period comprises setting the potential between said deep P well and said substrate to a fourth voltage with said N wells isolated, determining the potential between each of said N wells and said substrate; and subtracting said fourth voltage from said potential between each of said N wells and said substrate.

21. The method of claim 20 wherein said fourth voltage is equal to said third voltage.

22. The method of claim 15 wherein said determining the potential between each of said N wells and said deep P well at the end of said second charge integration period comprises maintaining the potential between said deep P well and said substrate at said third voltage with said N wells isolated, determining the potential between each of said N wells and said substrate; and subtracting said third voltage from said potential between each of said N wells and said substrate.

23. A pixel, comprising:

a P type silicon substrate;

a deep N well formed in said substrate, wherein said deep N well has a first depth and wherein said first depth is about equal to the depth of hole electron pairs generated in silicon by red light;

a number of P wells formed in said deep N well, wherein said each of said P wells has a second depth and wherein said second depth is about equal to the depth of hole electron pairs generated in silicon by green light;

an $N^+$ region formed in each of said P wells; and a $P^+$ region formed in said deep N well.

24. The pixel of claim 23 wherein said P type substrate is a P type epitaxial silicon substrate.

25. The pixel of claim 23 wherein said first depth is between about 1.0 and 3.00 micrometers.

26. The pixel of claim 23 wherein said second depth is between about 0.1 and 0.65 micrometers.

27. A pixel, comprising:

an N type silicon substrate;

a deep P well formed in said substrate, wherein said deep P well has a first depth and wherein said first depth is about equal to the depth of hole electron pairs generated in silicon by red light;

a number of N wells formed in said deep P well, wherein said each of said N wells has a second depth and wherein said second depth is about equal to the depth of hole electron pairs generated in silicon by green light;

a $P^+$ region formed in each of said N wells; and an $N^+$ region formed in said deep P well.

28. The pixel of claim 27 wherein said N type substrate is an N type epitaxial silicon substrate.

29. The pixel of claim 27 wherein said first depth is between about 1.0 and 3.00 micrometers.

30. The pixel of claim 27 wherein said second depth is between about 0.1 and 0.65 micrometers.

* * * * *